United States Patent [19]

Lehr et al.

[11] 4,005,266

[45] Jan. 25, 1977

[54] METHOD AND APPARATUS FOR SYNCHRONIZING MASTER AND LOCAL TIME BASE SYSTEMS

[75] Inventors: Stanley Lehr, New Rochelle; Philmore Coralnick, Spring Valley, both of N.Y.; Gary William Blauth, Glen Ridge, N.J.

[73] Assignee: The Singer Company, Little Falls, N.J.

[22] Filed: July 14, 1975

[21] Appl. No.: 595,629

[52] U.S. Cl. .............................. 178/69.1; 343/225
[51] Int. Cl.² ........................................... H04L 7/00
[58] Field of Search ............... 343/225; 178/69.5 R

[56] References Cited
UNITED STATES PATENTS

| | | | |
|---|---|---|---|
| 3,128,465 | 4/1964 | Brilliant | 343/225 |
| 3,851,101 | 11/1974 | En et al. | 178/69.5 R |
| 3,936,604 | 2/1976 | Pommerihing | 178/69.5 R |

*Primary Examiner*—Marshall M. Curtis
*Attorney, Agent, or Firm*—Thomas W. Kennedy

[57] ABSTRACT

A plurality of widely separated local time base systems are synchronized with a master time base system by means of digitally encoded radio signals. All of the time base systems comprise oscillator driven digital clocks which produce a cyclically recurring series of sequential time slots which are individually assigned to the master and local systems to provide time division multiple access to the master system from each local system. Coarse time synchronization is obtained by the transmission of a coarse synchronization signal from the master to each local system at the beginning of the series of slots in the master's time base which resets all local time bases to the beginning of the series of slots. Fine synchronization is made during the individual time slot assigned to each local system by the transmission of fine synchronization request and fine synchronization reply signals which are utilized to produce a synchronization error signal in each local system. The error signal is employed to generate frequency and phase corrections for the local oscillator and time corrections for the local clock in accordance with a programmed control state sequence in which the oscillator and clock correction gains used for a particular correction are determined by the number of system cycles between fine corrections and the magnitude of the error. A digital filter technique is utilized which approximates the operation of a simple Kalman filter.

15 Claims, 11 Drawing Figures

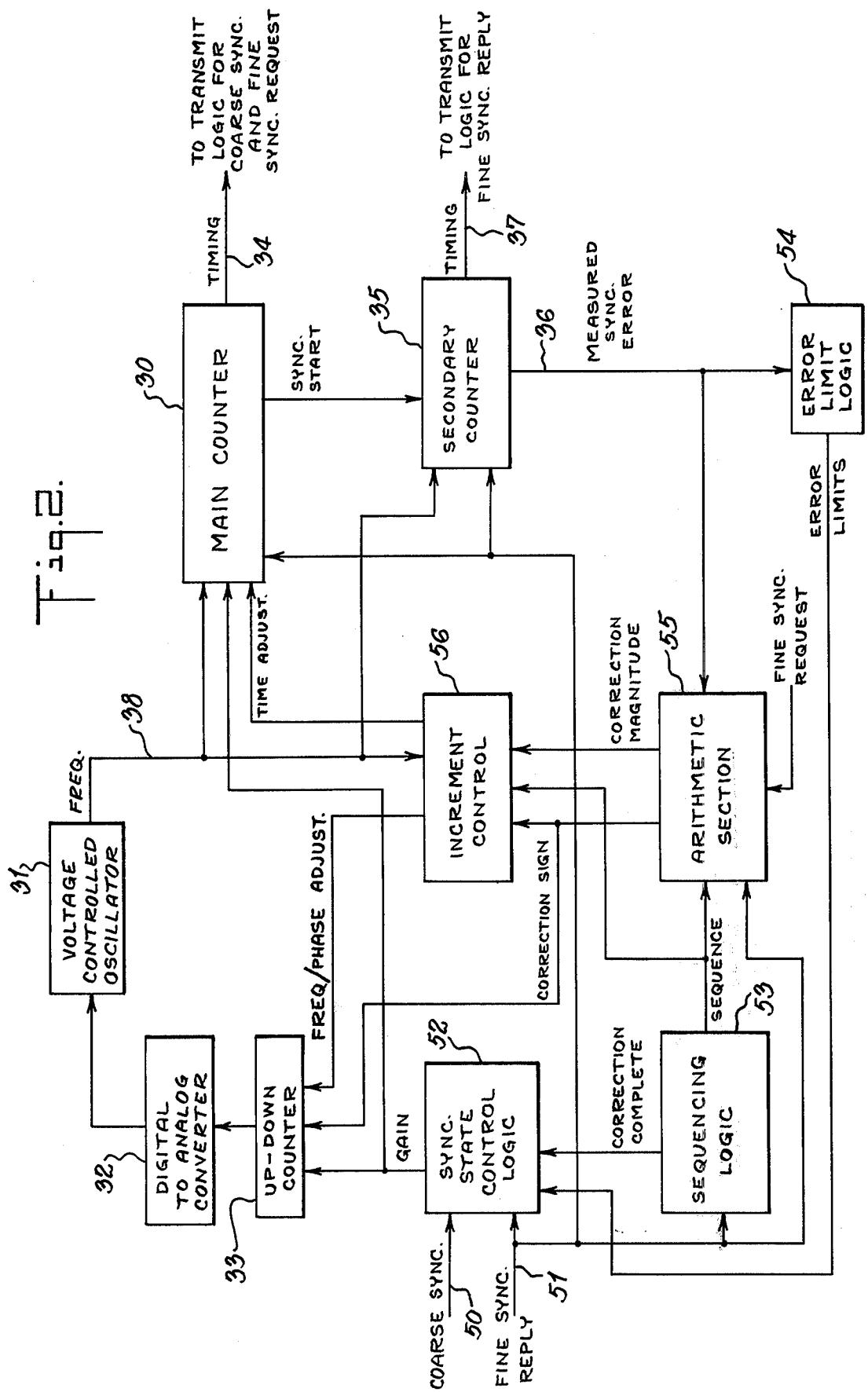

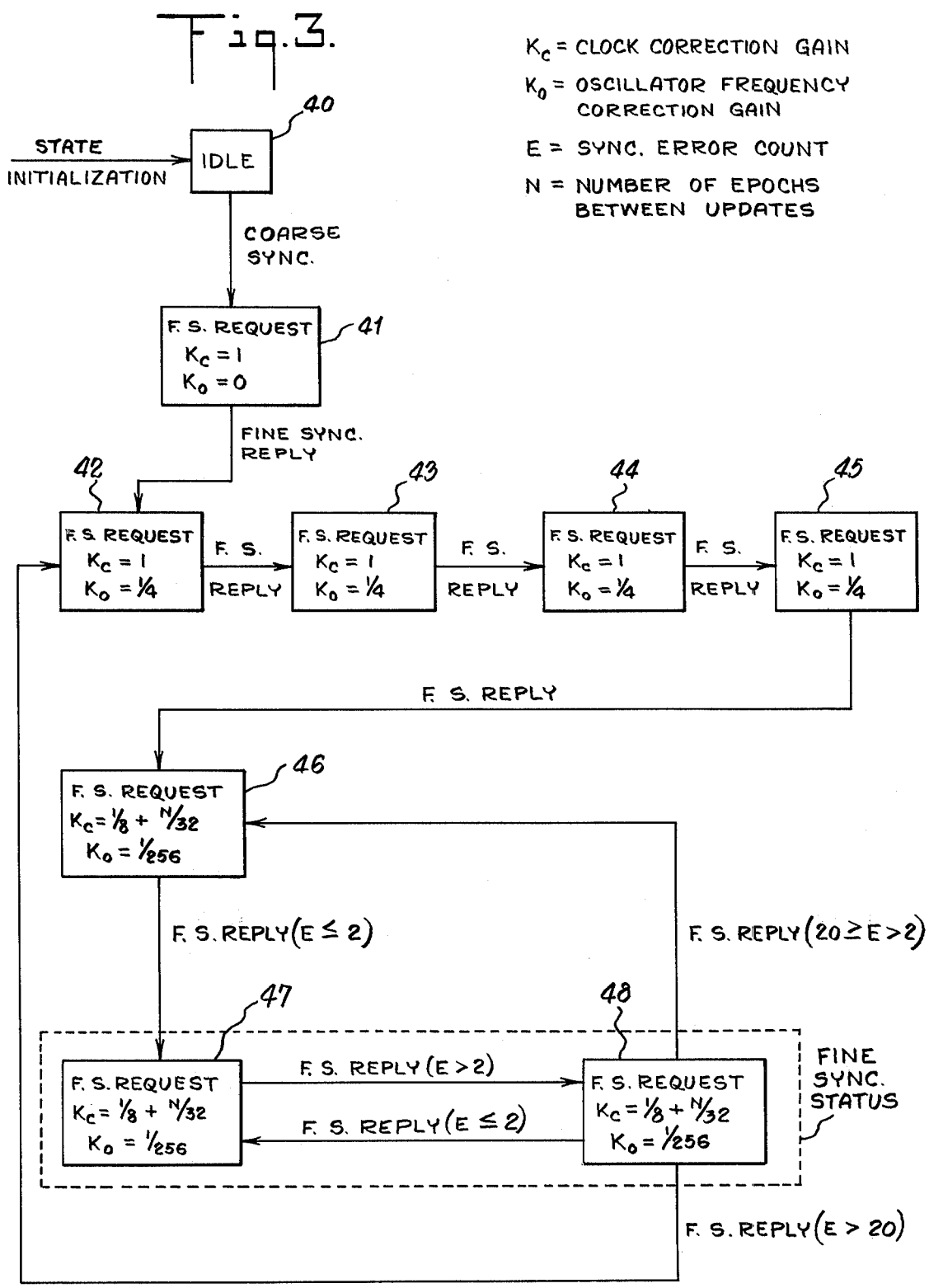

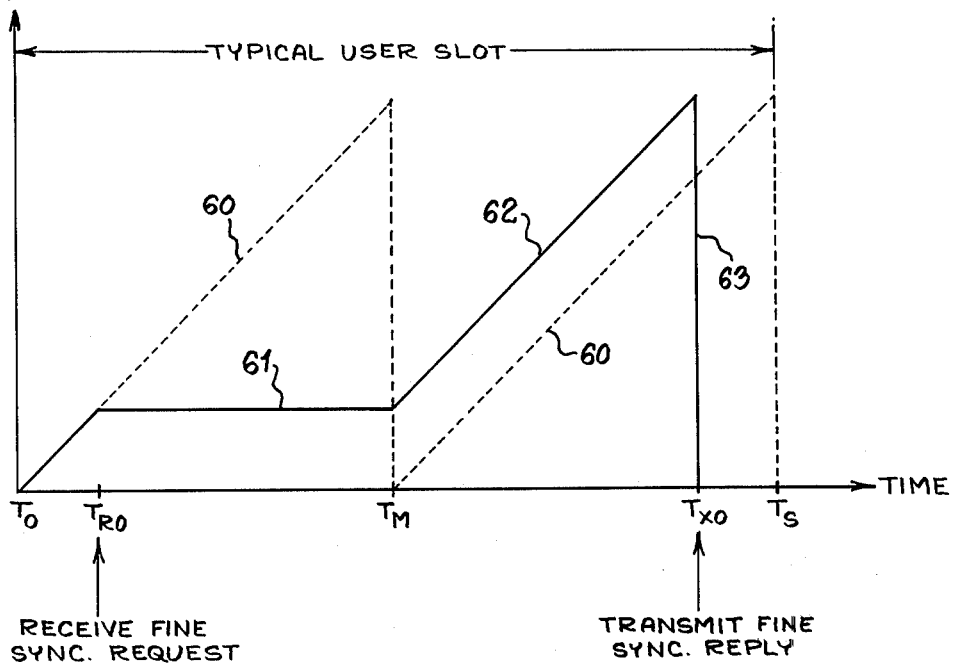
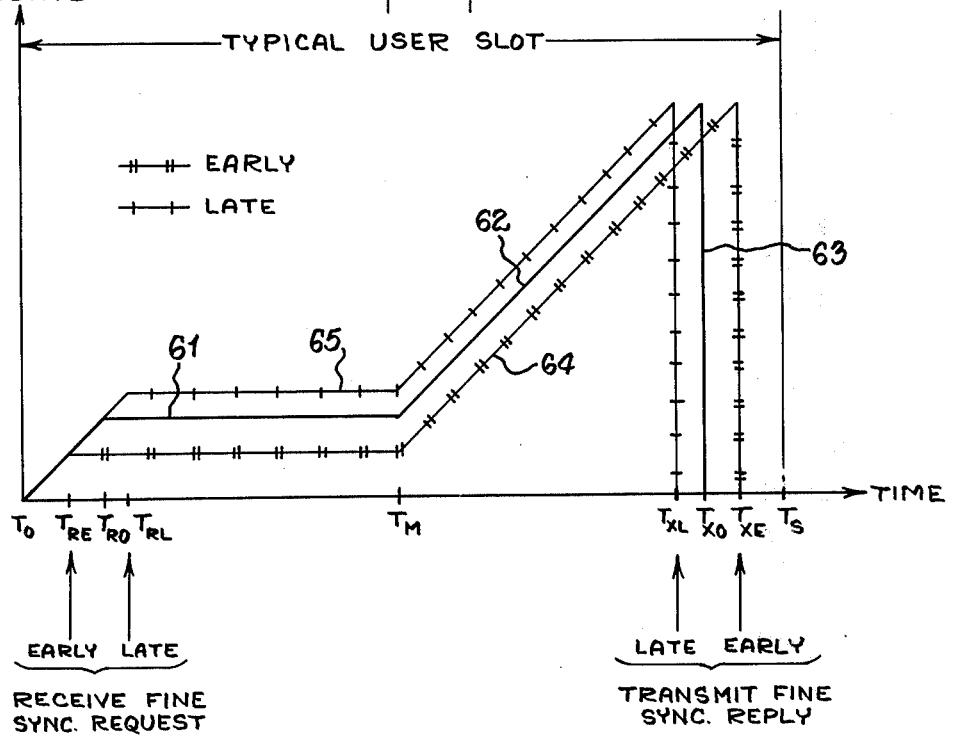

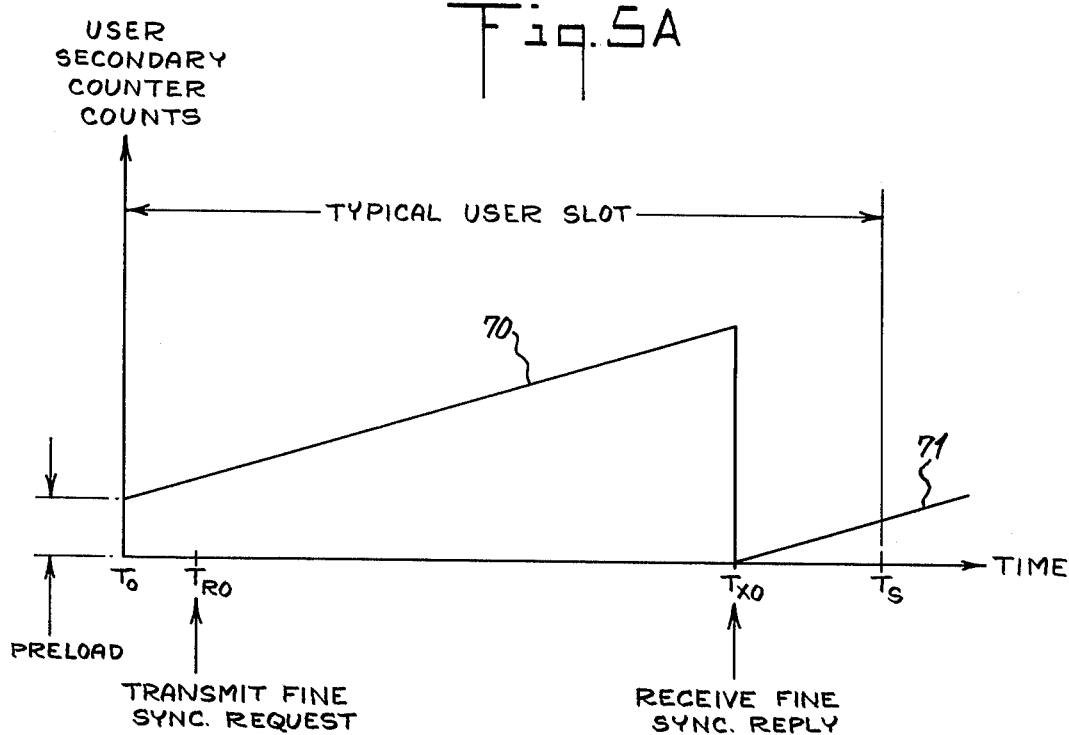
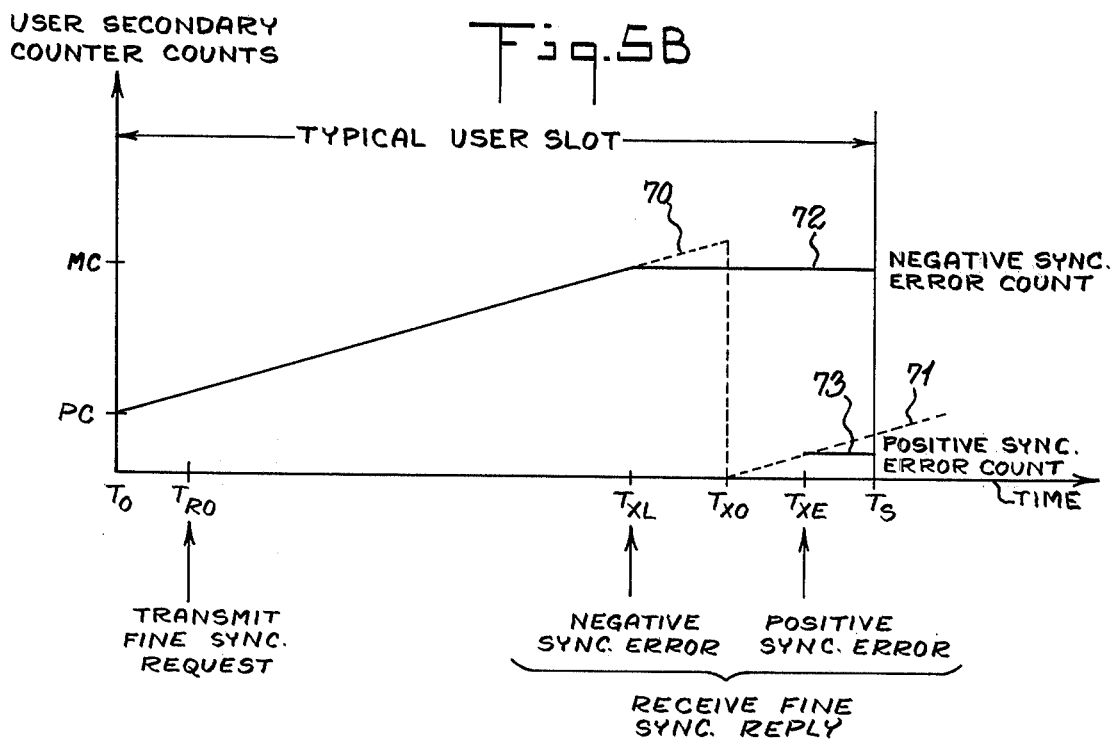

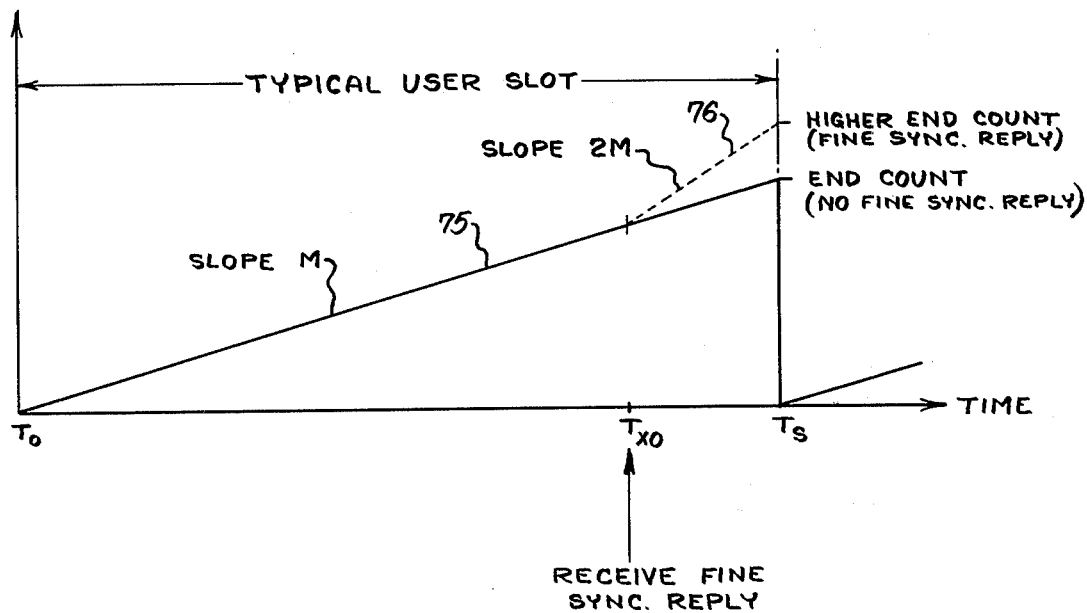
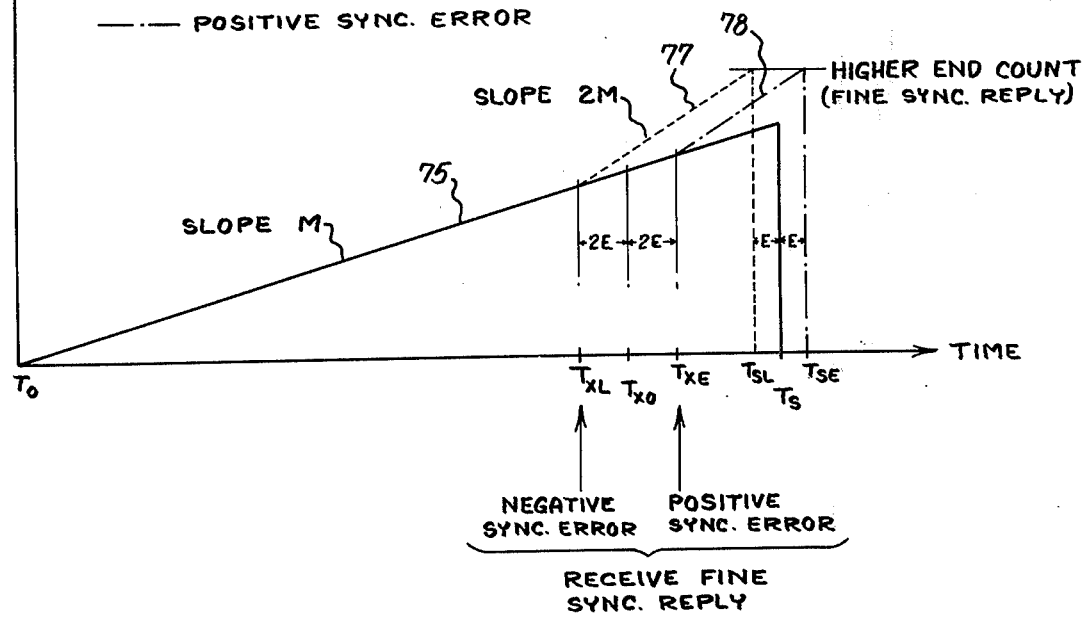

METHOD AND APPARATUS FOR SYNCHRONIZING MASTER AND LOCAL TIME BASE SYSTEMS

BACKGROUND OF THE INVENTION

1. Field of the Invention

This invention relates to time base system synchronization and more particularly to a method and apparatus for synchronizing one or more remotely located local clocks and oscillator frequencies with a master clock and master oscillator frequency.

2. Description of the Prior Art

Community navigation and control systems have been developed which permit a plurality of user aircraft, ships or other vehicles forming an operating community to navigate and be controlled by navigation and guidance signals received from a master or control aircraft, ship, vehicle or ground station. The user members of the community are linked to each other and to the master unit by radio linkages which employ digitally encoded signals for identification, event timing and data transmission. The radio ranging signals permit navigation by trilateration computations and transmit master navigational data from the control unit to each of the user vehicles. Time division multiple access techniques are utilized with the digitally coded radio transmission signals to permit two-way communication between the user members of the community and the controller and also to facilitate identification of the community members. The time base for the system is "real time" and consists of successively repeating system cycles or "epochs". Each system epoch or cycle is of a finite time duration and is divided up into a number of equal time "slots". Each of the user units and the control unit is assigned to a separate and different time slot in the system cycle, so that two-way radio communication between the control unit and each of the user units may be had once during each system cycle during the user's time slot. When the time base of each of the user units is synchronized with the time base of the control unit, the digitally encoded radio signals may be employed to time and sequence events and determine slant range measurements between units. Obviously the accuracy and reliability of systems of this type depend to a large extent upon the degree of synchronization between the clock systems of the user units and the clock system of the control unit. Since the members of the community may include aircraft, ships and other movable vehicles, a common power supply may not be employed and synchronization of the clock systems of the units must be accomplished by radio signals. The synchronization technique employed must not only be highly accurate and reliable but must also lend itself to mechanically-rugged mechanization which is suitable for use in land, sea and air environments.

Apart from use in community navigation systems, time base synchronization systems are often employed to synchronize the clock systems of a plurality of widely-separated computers and/or industrial control systems to permit joint computational use and/or joint industrial control applications. Furthermore, time base synchronization is used in purely horological applications to permit one or more remotely-located visual display clocks to be synchronized with a master clock to provide accurate and uniform visual time display at all locations.

Prior art time base synchronization systems generally make the time base correction by resetting or slaving the local time base to make the measured time error zero within the quantization level of the measurement. This technique makes the accuracy of such systems directly dependent on the accuracy of the discrete time error measurement which is, of course, corrupted by noise and degraded by system errors. Since the time synchronization error is measured instantaneously, it is subject to large deviations in steady state condition because of the inherently short time constant involved and because the past history of deviations and time error corrections are not reflected in the correction signal resulting from the instantaneous time error measurement. Such a system does not have the advantage of averaging multiple time error measurements to produce a time error signal which is dependent upon the rate-of-change of time synchronization errors over a short term history. Additionally, in the prior art systems, frequency corrections are generally not made to the local oscillators which produce the basic clock rate, with the result that the quality and accuracy of the generated local time base is very dependent upon the quality of the local oscillators employed, so that the use of relatively inexpensive, commercially-available oscillators of poor quality is precluded. Some of the known time base synchronization systems utilize frequency and time standard radio signals which are broadcast from National Bureau of Standards radio stations. Comparison receivers are used to compare the received frequency and time signals with the frequency and time of local time base systems to produce an error signal which is then employed to bring the local systems into synchronization with the transmitted frequency and time standards. These systems are dependent for their accuracy on a long time integration which requires very large averaging times. The equipment required is complex and expensive and is usually suitable for use only in a controlled laboratory environment.

SUMMARY OF THE INVENTION

It is an object of this invention to provide a method and apparatus for time base synchronization wherein the synchronization error signal reflects the rate-of-change of time errors over a short term history, so that the resulting time base correction reflects the recent history of prior time corrections required.

It is a further object of this invention to provide a method and apparatus for time base synchronization which may be employed to not only slave remotely-located local clocks to a master clock but also to make local oscillator frequency and phase corrections.

It is a still further object of this invention to provide a method and apparatus for time base synchronization wherein relatively inexpensive and commercially-available local oscillators of poor quality may be employed in the local time base systems without sacrificing the accuracy and stability of the systems.

It is another object of this invention to provide a method and apparatus for time base synchronization wherein the frequency and time corrections are derived from digital filter techniques which simulate the operation of a simple Kalman filter.

It is an additional object of this invention to provide a method and apparatus for time base synchronization which provides rapid, accurate slaving of remotely-located local clocks and oscillators to a master clock and oscillator through the use of coded or uncoded radio signals.

It is another object of this invention to provide a method and apparatus for time base synchronization which permits the use of mechanically-rugged equipment which is suitable for use in aircraft, ship and other operating environments.

Briefly, the time base synchronization system of the invention permits one or more local time base systems, each having an oscillator driven clock, to be synchronized to a master time base system having an oscillator driven clock. The time synchronization error between the systems is measured at predetermined sampling times and frequency and phase correction signals for the local oscillators and time correction signals for the local clocks are derived from the measured error at each of the sampling times. The oscillator correction signals are applied to the local oscillator and the time correction signals are applied to the local clock at gains which are a function of the magnitude of the error and the number of sampling times between corrections, so that corrections are made which are based upon the rate-of-change of error over the recent history of prior error corrections and not merely upon the instantaneous value of the measured error at each sampling time. The specific oscillator and clock gains employed for a particular correction are determined by the control state of the local synchronization system which has a programmed control state sequence in which transfer between control states for large initial errors is made automatically for a predetermined number of sequentially occurring corrections and is dependent upon the magnitude of the error for smaller subsequent corrections. The oscillator and clock correction gains for a particular control state may be constant or variable or may depend upon the summation of a constant with a variable. The variable employed is the number of sampling times between corrections which, for a constant sampling rate, is actually a measure of the elapsed time between corrections. A digital filter which approximates the operation of a simple Kalman filter is utilized to generate the local oscillator frequency and phase correction signals and the time correction for the local clock.

The nature of the invention and other objects and additional advantages thereof will be more readily understood by those skilled in the art after consideration of the following detailed description taken in conjunction with the accompanying drawings.

BRIEF DESCRIPTION OF THE DRAWINGS

In the drawings:

FIG. 2 is a functional block diagram of a time base synchronization system constructed in accordance with the teachings of the present invention;

FIG. 3 is a control state sequencing diagram showing the clock and oscillator correction gains utilized in each control state and the sequence of control states during synchronization for the community navigation system described;

FIGS. 4A and 4B respectively illustrate the output of the secondary counter of the controller time base system as a function of time for the situation where the synchronization error is zero and the situation where the synchronization error is not zero;

FIGS. 5A and 5B respectively illustrate the output of the secondary counter of a user time base system as a function of time for the situation where the synchronization error is zero and the situation where a synchronization error exists;

FIGS. 6A and 6B respectively illustrate the output of the slot timer section of the main counter of the user unit for the situation where there is no synchronization error and the situation where a synchronization error exists;

DESCRIPTION OF THE PREFERRED EMBODIMENT OF THE INVENTION

Figure 1:
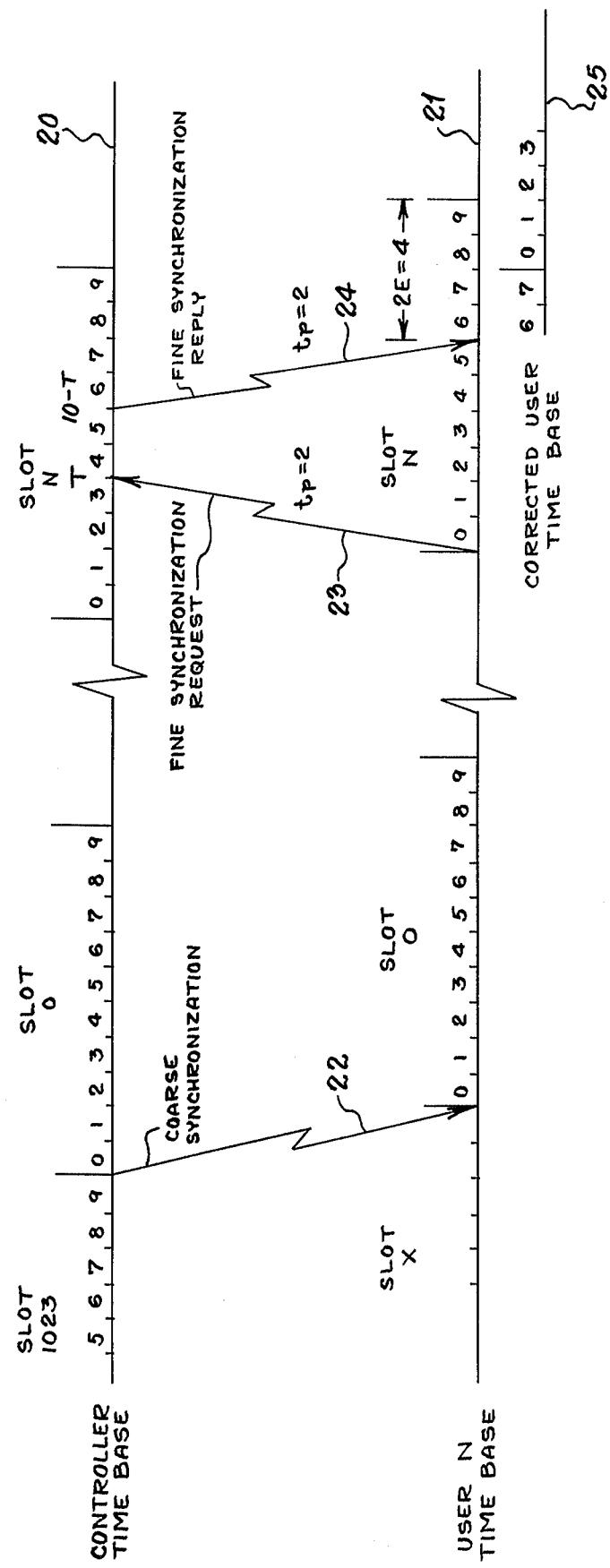
FIG. 1 is a schematic diagram illustrating the controller time base in relation to a user time base and showing the transmission sequence of the coarse synchronization, fine synchronization request and fine synchronization reply signals in the time base synchronization system of the invention.

Referring now to FIG. 1 of the drawings, there is shown the master time base 20 of the controller in a community navigation system in relation to the time base 21 of a user vehicle N of the system. In the illustrated system, the controller generates a master time base which consists of successively recurring system cycles or epochs. Each system cycle or epoch generated by the controller consists of a series of 1,024 separate time slots of which one time slot is assigned to the controller and the remaining time slots are individually assigned to the user members of the operating community, so that provision is made in the example given for 1,023 system users. In the example chosen, the time duration of a single cycle or epoch is 2.68 seconds, so that each of the time slots within the epoch is 2.62 milliseconds in duration. The controller time base shown in FIG. 1 has been foreshortened for convenience of illustration and shows slot 0 which is assigned to the controller, slot N which is assigned to user N and slot "1,023" which is assigned to user 1,023 of the community. The time base 21 which is individually generated by each user member of the community is the same as the controller time base and will also consist of 1,024 slots each having a time duration of 2.62 milliseconds and an epoch time of 2.68 seconds in the example given.

In a community navigation system of the foregoing type, it is essential that the local time base generated by each system user be in close synchronization with the time base generated by the controller, since two-way radio communication between each user and the controller is made during the unique time slot assigned to that user. The radio linkages between the controller and the users are utilized to permit navigation by trilateration computations which employ radio slant range measurements between the users and the controller at various positions in the navigational grid defining the operating community. Synchronization is obtained through the use of coarse synchronization, fine synchronization request and fine synchronization reply radio signals which are digitally encoded with unique codes to identify them to the user and controller members of the operating community. Each of these synchronization signals may be conveniently generated through the use of biphase modulation techniques and Barker encoding may be employed to identify the particular synchronization signal involved. The Barker code may, for example, consist of a sequentially-transmitted train of 13 bits. If biphase modulation techniques are employed, each bit will be defined as the presence or absence of a phase shift in the transmitted RF signal. The radio receivers which receive the signals may employ differential phase decoding which is asynchronous in operation. During decoding, the receiver sums the amplitude of the received sequential pulse train over the interval of the train and the resulting output pulse has its amplitude multiplied by the number of bits in the Barker code. The resulting pulse which is a timing pulse which initiates a particular event in the foregoing example would have an amplitude gain of 13 since a 13 bit code is employed. It will be understood, however, that any suitable method for the transmission and reception of the synchronization signals may be employed with the present invention depending upon the application to which the invention is put.

In FIG. 1 of the drawings, the time base 21 of a user N of the operating community is shown as being out of synchronization with the time base 20 of the controller. Accordingly, when the controller time base is generating slot 1023, the user time base is generating a slot X. At the beginning of slot 0, which is assigned to the controller of the community, the controller transmits a coarse synchronization signal 22 which is received by all of the user craft in the community including user N. When this signal is received by the user N it is employed to reset the user's clock or time base to the start of an epoch as illustrated in FIG. 1. Since the coarse synchronization signal is received by user N after a time delay $t_p$ equal to the RF propagation time between the controller and user, the user's time base will have a relative synchronization error E with respect to the controller's time base which is equal to the RF propagation time. At this point, coarse synchronization has been achieved between the controller and user clocks. As the system cycle or epoch continues, slot N is reached in the user's clock. Since this time slot has been uniquely assigned to user N, the user N transmits a fine synchronization request signal 23 at the start of its slot N which is received by the controller at a time T in slot N on the controller's time base. When the controller receives this signal, it measures the elapsed time between the start of its slot N to the receipt of the fine synchronization request signal at time T. The controller then transmits a fine synchronization reply signal 24 at a time (10−T) in its slot N which is distant from the end of its slot the same distance as time T is distant from the start of the slot. When the fine synchronization reply signal 24 is received by user N, the user measures the elapsed time between the receipt of the fine synchronization reply signal and the end of its slot N. The magnitude of the elapsed time so measured is equal to twice the time synchronization error E which exists between the user and controller clocks. Since the user N now has information giving it the magnitude of double the error E, it then adjusts its local time base by one-half of the measured amount to thereby bring its time base into synchronization with the controller time base.

For example, in the time bases illustrated in FIG. 1 of the drawings, the user N time base 21 is shown as being out of synchronization with the controller time base 20 by two units of a ten unit slot. Assuming that the RF propagation time $t_p$ between the controller and user is also two units of a slot, the fine synchronization request 23 transmitted by the user N will be received by the controller at a time T which is distant four units from the beginning slot N. The controller then transmits the fine synchronization reply signal 24 at a time which is four units distant from the end of slot N, so that the fine synchronization reply signal is received by the user N at a time which is distant four units from the end of its slot N. The user N then measures the elapsed time of four units from the receipt of the fine synchronization reply signal to the end of its slot N and adjusts its local clock by a factor equal to one-half this amount or by a factor of two units. Accordingly, the user N adjusts its clock to begin transmitting the next slot when eight units of its slot N have elasped, so that its corrected time base 25 is then in synchronization with the time base 20 of the controller. The fine synchronization request and fine synchronization reply signals are respectively transmitted by the user and the controller once every complete system cycle or epoch, so that the synchronization error E is measured once every system circle which for the example previously given is once every 2.68 seconds. When the initial fine synchronization of the user time base to the controller time base is achieved, the coarse synchronization signal transmitted by the controller at the beginning of slot 0 is no longer utilized since this would automatically produce a loss of synchronization between the user N time base and the controller time base equal to the RF propagation time or the coarse signal. Accordingly, the coarse synchronization signal is only utilized by the user N when initial synchronization or acquisition is achieved, such as, for example, when the user N first joins the operating community controlled by the controller.

A functional block diagram of a synchronization system constructed in accordance with the teachings of the present invention is shown in FIG. 2 of the drawings. The system shown in FIG. 2 may be employed for both the controller and the user members of the operating community. When the system is employed for the controller member of the operating community, its time base correction logic would be inhibited because the controller time base is the reference or master for the entire community so that no correction is necessary. Accordingly, the system illustrated in FIG. 2 will be described mainly with reference to its use in a user member of the community. A main digital counter or divider 30 and a voltage-controlled relaxation oscillator 31 provide the means for generating the local time base for each user member of the community. Together, these units form a clock system for the user which is employed in its navigational equipment and which must be kept in synchronization with the corresponding clock system of the controller. The voltage controlled oscillator 31, which may comprise an oscillator of relatively poor quality, has an output frequency which is controlled by the voltage applied to the oscillator from the output of a digital-to-analog converter 32 which is, in turn, driven by the digital output of an up-down counter 33. The up-down counter 33 is initially set to mid-range and is incremented or decremented by a series of pulses proportional to the measured synchronization error. The input signals to this counter control the oscillator frequency and phase and the sign or direction of correction. The gain of the oscillator correction is determined by the tap on the up-down counter to which the correction signal is applied as will be explained hereinafter. The timing output 34 of the main counter 30 generates the user time base which must be kept in synchronization with the time base of the controller. This output in the user is coupled to the transmit logic which causes the fine synchronization request signal to be transmitted at the beginning of the user's assigned slot. In the controller, the timing output 34 causes the transmit logic to generate the coarse synchronization signal at the beginning of the controller slot 0.

A secondary counter or divider 35 is utilized in the synchronization system to perform a number of functions. This counter is a working counter which makes the synchronization error measurements in the user member of the community by measuring the elapsed time between the receipt of the fine synchronization reply signal and the end of the user's assigned slot. Accordingly, the secondary counter has an output 36 which expresses the measured synchronization error in digital form. In the control member of the community, the secondary counter 35 provides a timing output 37 which is applied to the radio transmit logic to generate the fine synchronization reply signal at the required time before the end of the user's assigned slot. This function of the secondary counter is inhibited when the synchronization system is used in a user vehicle. The third function performed by this counter is that of making slant range measurements to determine distance between operating members of the community by the trilateration computations referred to previously. Both the main counter 30 and the secondary counter 35 may comprise known digital frequency dividers. For example, the main counter 30 may comprise a 28 bit digital divider which is driven by a 100 Mhz. frequency output from the oscillator 31. The system cycle or epoch time is then determined by the period of the most significant bit in the main divider and the measurement resolution of approximately 10 nanoseconds is established by the period of the 100 Mhz. oscillator 31. The 10 most significant bits of the main divider are utilized for the slot counting function and the 18 least significant bits are reserved for the slot timing function. When a time synchronization error is measured by the user, the user must adjust the phase and frequency of its local clock system so that the state of its main counter 30 is the same as the state of the controller's main counter at any instant of time. This is accomplished by adjusting the total phase of the frequency source plus the divider and by adjusting the frequency of the source. As shown in FIG. 2, the output frequency 38 from the oscillator 31 is employed to drive both the main counter 30 and the secondary counter 35.

The balance of the system shown in FIG. 2 of the drawings is employed to generate the frequency and phase correction signals for the oscillator and the time correction signals for the main counter. It programs control states and acts as a digital filter to generate time and frequency corrections as a function of the measured synchronization error and elapsed time since the last correction. As will be explained hereinafter, the algorithm for this filter approximates the operation of a simple Kalman filter which is essentially a linear filter with time-varying gains. The filter logic accepts a measured time base synchronization error and processes it in accordance with the filter algorithm to generate a time correction for the main counter 30 and frequency and phase corrections for the oscillator 31. The filter algorithm smoothes time, frequency and phase corrections to produce close synchronization between the user oscillator and main counter and the oscillator and main counter of the controller. The development of this filter will now be described for the foregoing system.

In developing the Kalman filter, the errors due to constant oscillator drift can be represented by the equations:

$$\omega_n{}^c = \omega_{n-1}{}^c + \dot{\omega}\Delta t \qquad (1)$$

and $$\theta_n{}^c = \theta_{n-1}{}^c + \omega_{n-1}{}^c \Delta t + \tfrac{1}{2} \dot{\omega}(\Delta t)^2 \qquad (2)$$

where $\omega_n{}^c$ is frequency error at time $t_n$ due to oscillator drift, $\theta_n{}^c$ is the phase error at time $t_n$ due to oscillator drift, $\dot{\omega}$ is the oscillator drift rate, and $\Delta t$ is the sampling interval. The random oscillator noise can be represented as a Markov process with time constant $\tau$ (autocorrelation time). The errors at each sampling time can be represented by the equations:

$$\omega_n{}^r = K_0 \omega_{n-1}{}^r + K_1 R_n \; ; \text{and} \qquad (3)$$

$$\theta_n{}^r = \theta_{n-1}{}^r + K_2 \omega_{n-1}{}^r + K_3 R_n, \qquad (4)$$

where $$K_0 = e^{-\Delta t/\tau}$$

$$K_1 = (1 - e^{-2\Delta t/\tau})^{1/2},$$

$$K_2 = \tau(1 - e^{-\Delta t/\tau}),$$

and $$K_3 = (1 - e^{-2\Delta t/\tau})^{1/2} \left( \frac{\Delta t}{(1 - e^{-\Delta t/\tau})} - \tau \right).$$

and $\omega_n{}^r$ is the frequency error at time $t_n$ due to random oscillator noise, $\theta_n{}^r$ is the phase error at time $t_n$ due to random oscillator noise, $R_n$ is a Gaussian random variable with zero mean, and standard deviation equal to oscillator random noise, $\tau$ is the autocorrelation time of the noise, and $\Delta t$ is the sampling interval. The total phase and frequency errors may be represented by the following equations:

$$\theta_n = \theta_n{}^r + \theta_n{}^c \qquad (5)$$

$$\omega_n = \omega_n{}^r + \omega_n{}^c \qquad (6)$$

With these equations, the error dynamics can be written in matrix form as follows:

$$(7) \quad \begin{pmatrix} \theta_n \\ \omega_n \\ \omega_n{}^r \end{pmatrix} = \begin{pmatrix} 1 & 0 & K_2 & \Delta t & \tfrac{1}{2}(\Delta t)^2 \\ 0 & 0 & K_0 & 1 & \Delta t \\ 0 & 0 & K_0 & 0 & 0 \end{pmatrix} \begin{pmatrix} \theta_{n-1} \\ \omega_{n-1} \\ \omega_{n-1}{}^r \end{pmatrix} + \begin{pmatrix} K_3 \\ K_1 \\ K_1 \end{pmatrix} \cdot [R]$$

-continued $$\begin{bmatrix} \omega_n{}^c \\ \dot{\omega} \end{bmatrix} \quad \begin{bmatrix} 0 & 0 & 0 & 1 & \Delta t \\ 0 & 0 & 0 & 0 & 1 \end{bmatrix} \quad \begin{bmatrix} \omega_{n-1}{}^c \\ \dot{\omega} \end{bmatrix} \quad \begin{bmatrix} 0 \\ 0 \end{bmatrix}$$

The measurement of time relative to the controller reference clock (neglecting quantization) can be represented by:

$$(8) \quad \theta_n{}^T = \begin{pmatrix} 1 & 0 & 0 & 0 & 0 \end{pmatrix} \begin{pmatrix} \theta_n \\ \omega_n \\ \omega_n{}^r \\ \omega_n{}^c \\ \dot{\omega} \end{pmatrix} + V_n,$$

where $\theta_n{}^T$ is the phase measurement at time $t_n$, and $V_n$ is a Gaussian random variable representing measurement random error.

The above state and measurement equations comprise a linear system of the form:

$$\overline{X}_n = [F]\, \overline{X}_{n-1} + [G]\, \overline{U}_n \,; \text{ and} \qquad (9)$$

$$Y_n = [H]\, \overline{X}_n + V_n. \qquad (10)$$

For these sets of equations, a Kalman filter may be applied for obtaining a recursive optimal estimate of the state vector $X_n$ given observations $Y_n$. The state estimate at each update time n is given by:

$$\hat{X}_n = [F]\, \hat{X}_{n-1} + [K_n]\, \{Y_n - [H][F]\, \hat{X}_{n-1}\}, \qquad (11)$$

where $\hat{X}_n$ is the state estimate at time $t_n$, $[K_n]$ is a gain matrix, and $Y_n$ is the observation or measurement. If, after each measurement the system total phase ($\theta$) and frequency ($\omega$) errors are corrected by an amount equal to the associated state estimates, then the estimation equation becomes:

$$\hat{X}_n = [F]\, \hat{X}_{n-1} + [K_n]\, Y_n, \qquad (12)$$

since $[H][F]\, \hat{X}_{n-1}$ has been made zero. Thus the objective here is to correct the total phase and frequency errors ($\theta$ and $\omega$), given the phase measurement ($\theta^T$). The corrections are the negative of the state estimates found based upon the above equations:

$$\theta_n = K_c\, \theta_n{}^T \rightarrow \Delta\theta = -K_c\, \theta^T; \qquad (13)$$

$$\omega_n = K_o\, \theta_n{}^T \rightarrow \Delta\omega = -K_o\, \theta^T, \qquad (14)$$

where $K_c$ and $K_o$ are the gains for the clock and oscillator, respectively. The optimum values of these gains are time-varying, and dependent on the sampling rate as well as covariance matrix uncertainties associated with all five states.

By utilizing the foregoing linear model as a design tool for obtaining a suitable approximation to the optimum gain values, Kalman gain matrix values may be computed and evaluated using the following equations:

$$[M_n] = [F]\, [P_{n-1}]\, [F]^T + [G]\, [Q]\, [G]^T \qquad (15)$$

$$[K_n] = [M_n]\, [H]^T\{[H]\, [M_n]\, [H]^T + \sigma_v\}^{-1}; \text{ and} \qquad (16)$$

$$[P_n] = [1] - [K_n]\, [H]\, [M_n], \qquad (17)$$

where $[P_n]$ is the state covariance matrix at time $t_n$ or $E(\hat{X}_n \hat{X}_n{}^T)$ given all observations up to and including $Y_n$, $[M_n]$ is the state covariance matrix at time $t_n$ or $E(\overline{X}_n \overline{X}_n{}^T)$ given all observations up to and including $Y_{n-1}$, $Q$ is the constant oscillator random noise matrix given by $E(\overline{U}_n \overline{U}_n{}^T)$ for any $n$, and $\sigma_v$ is the constant random time measurement error given by $E(V_n{}^2)$ for any $n$.

In the foregoing covariance and for the synchronization problem outlined, a 1 Hz, 1$\sigma$, initial frequency error and 600 ms initial phase error between the user and controller clocks may be assumed together with a random oscillator noise of 0.1 Hz RMS, a long drift value of 1 Hz per day maximum, and a correlation time for the random oscillator noise of 4 hours. With these parameters, the optimum gains for the oscillator and clock corrections may be determined for the sampling intervals utilized. In the system discussed previously, the epoch time of 2.68 seconds is the time between the updates for each user member of the operating community and is therefore the sampling interval. For this sampling interval, the following gain variations have been found:

TABLE I

| Update Number | $K_o$ | $K_c$ |
| --- | --- | --- |
| 1 | 0 | 1 |
| 2, 3, 4, 5 | high | 1 |
| 6, 7 | low | low plus variable as a function of N. |

In the foregoing table, N is the number of system cycles between updates. A phase or time correction of $\Delta\theta$ from equation (13) is added to the clock and a frequency correction of $\Delta\omega$ from equation (14) is added to the oscillator after each update. The clock correction is rounded off to the digitization time of the clock which, in the example previously given, is 10 nanoseconds. The round off remainder may be accounted for by making a phase correction to the oscillator.

Table I illustrates how the oscillator and clock gains may be varied as the synchronizing system passes through successive updates. After the user time base is initialized by the coarse synchronization signal, the first update occurs when the slot assigned to that user is reached in the system cycle. During the first update, which is produced by the fine synchronization request and fine synchronization reply signals in the user's slot of that epoch, the clock gain $K_C$ is unity and the oscillator gain $K_0$ is zero. During the next four successive updates (updates 2, 3, 4 and 5), the clock gain remains at unity but the oscillator gain is increased. For the sixth update, the clock gain is reduced by a constant plus a variable which depends upon the number of missed updates N and the oscilltor gain is reduced to a low value. The clock and oscillator gains remain at these values during the seventh and succeeding updates provided, however, that the measured synchronization error E is equal to or less than a predetermined count. If, on a succeeding update, the error E exceeds the predetermined count for that update and if, for the next succeeding update, the error still exceeds the predetermined count, the system is shifted into a state which may have higher clock and oscillator gains. If the error which exceeds the predetermined count is not repeated for the two successive updates previously mentioned, the gains are kept at the values used in the sixth and seventh updates because it is assumed that the high error value was merely a transient. If the error exceeds the predetermined count by a large margin and is repeated for two successive updates, the clock and oscillator gains are returned to the high values employed in updates 2, 3, 4 and 5 and the control state sequence for these and succeeding updates will be repeated again. If the error is greater than the predetermined count but not by such a wide margin and the error is repeated for the two successive updates, the system may be returned to the control state having intermediate clock and oscillator gains.

The specific clock and oscillator gains which are employed for a specific system will, in general, depend upon the Kalman filter algorithm utilized in the system which, in turn, will depend upon the system parameters. For example, for the system parameters and component characteristics previously outlined, and for an epoch time of 2.68 seconds with 1,024 slots to an epoch, the specific clock and oscillator gain values shown in the following table may be utilized:

TABLE II

| Update Number | $K_o$ | $K_c$ |
|---|---|---|
| 1 | 0 | 1 |
| 2, 3, 4, 5 | 1/4 | 1 |
| 6, 7 | 1/256 | $1/8 + N/32$. |

Again, N is the number of epochs or cycles between updates. The foregoing gain values are approximations which have been established by simulation techniques for the system parameters previously discussed.

A control state sequence diagram for Table II is shown in FIG. 3 of the drawings wherein the various control states assumed by the user's synchronizing system are illustrated in terms of clock gain, oscillator gain, synchronization error count and the number of epochs between updates. As seen in FIG. 3, when the user's synchronization system is initially turned on it is placed in an idle state 40 wherein it awaits the receipt of the coarse synchronization signal from the controller. When the coarse synchronization signal is received by the user, the user's time base is reset to start the generation of a new epoch with slot 0 and the user's system is placed in control state 41 for the first fine update. In this state, the clock gain is unity and the oscillator gain is zero to allow for the correction of large initial phase errors. For the second, third, fourth and fifth updates, the user's system shifts through the control states 42, 43, 44 and 45 wherein the clock gain remains at unity but the oscillator gain is increased to ⅔ unity gain. The increase in the oscillator gain during the second through the fifth updates permits the correction of large initial frequency errors. For the sixth update, the user's system shifts to control state 46 wherein the clock gain is reduced to a value equal to ⅛ unity gain plus a fraction N/32 which is dependent upon the number of epochs between updates. The oscillator gain is decreased to a small steady state value of 1/256 of unity gain. The clock and oscillator gains of the control state for the sixth update are maintained until the synchronization error count E becomes equal or less than 2 at which time the user's system shifts to control state 47. The clock and oscillator gains in control state 47 are the same as control state 46 and are maintained at this level and in this control state until the error E becomes greater than 2. When the error E becomes greater than 2, the user's system shifts into control state 48 which again maintains the same steady state clock and oscillator gains as control states 46 and 47. On the next update, if the error E is equal to or less than 2, the user system is returned to control state 47 on the assumption that the higher error value was merely a transient and was consequently not repeated on successive updates. If, on the other hand, the error E is greater than 2 with the system in control state 48, the user system is returned to one of the previous control states depending upon the magnitude of the error. If the error is greater than 2 but less than or equal to 20, the user system is returned to control state 46 which has the steady state values for the clock and oscillator gains which may handle a small correction. If the error E is greater than 20 with the system in control state 48, the user system is shifted back to control state 42 which has the higher clock and oscillator gains required to handle the larger magnitude of error. The system then follows the programmed sequence of control states 42, 43, 44, 45, 46 and 47 until the error is reduced to an acceptable level. Accordingly, it is believed apparent that the digital filter functions to generate time and frequency correction data as a function of the measured synchronization error and the elapsed time since the last correction or update. It is essentially a simple linear filter with time-varying gains.

Referring again to FIG. 2 of the drawings, the digital filter function will now be described in terms of system components. As shown in FIG. 2, a coarse sync. input signal 50 and a fine sync. reply input signal 51 are applied to sync. state control logic 52. The coarse sync. input signal 50 is a pulse which represents the digitally encoded RF signal which was transmitted by the controller. When the digitally encoded RF coarse synchronization signal is received by the user it is decoded to produce an output pulse representing the signal. The decoder utilized may, for example, comprise known digital comparator circuits which compare a known digital signal with an unknown signal on a bit-by-bit basis to produce a pulse output when thereis complete identity of digital information. In a similar fashion, the fine synchronization reply RF signal is decoded to produce a fine sync. reply pulse 51, so that the sync. state control logic 52 receives only the pulses representing the receipt of these signals. The sync. state control logic 52 controls the gain of the oscillator and clock corrections and consequently receives inputs from sequencing logic 53 and an error limit logic 54, since the clock and oscillator gains depend upon the control state the user system is in, the number of epochs between updates and the predetermined counts of the error signal E. The fine sync. reply input signal 51 is not only applied to sync. state control logic 52 and sequencing logic 53 but also to an arithmetic section 55, the secondary counter 35 and the main counter 30. The arithmetic section 55 is also responsive to the measured sync. error from the secondary counter 35 and is also controlled by the sequencing logic 53. The arithmetic section 55 provides outputs representing the magnitude and sign of the required corrections and applies these to an increment control 56 which produces frequency and phase adjustments for the up-down counter 53 and time adjustments for the main counter 30.

During initial synchronization when the user first joins the operating community, the receipt of the coarse sync. input signal 50 by the user serves to reset the main counter 30 and the sync. state control logic 52 to cause the user to begin the generation of a complete epoch at the start of the epoch. This correction is made in a high gain mode by making a direct correction to the main counter 30. When the user's main counter 30 reaches the beginning of the individual time slot assigned to that user, the timing output 34 from the main counter causes the user to transmit the fine sync. request signal to the controller. The controller then transmits the fine sync. reply signal. When the fine sync. reply signal is received by the user, the sync. error counter which is secondary counter 35 is stopped and the measured sync. error E is applied to the arithmetic section 55. The sequencing logic 53 and arithmetic section 55 combine with the increment control 56 to generate frequency, time and phase correction signals through the implementation of the filter algorithm which is modified as a function of number of epochs between updates. First, the oscillator 31 is adjusted in frequency by the digital-to-analog converter 32 and the up-down counter 33 under the control of the increment control 56. Then the increment control 56 increments or decrements the main counter 30 to adjust the time. Finally, fractional time corrections or phase corrections are made by adjusting the phase of the oscillator 31 by making a frequency offset for a known period of time.

In FIG. 4A of the drawings, the operation of the secondary divider of the controller is illustrated for the situation wherein the synchronization error E between the controller and user is zero and where radio propagation time delay is neglected. The count or output of the secondary divider is shown as a function of time. The secondary counter period of the controller is adjusted to cycle as shown by the dotted line 60, so that the secondary counter has two full cycles during each user slot generated by the main counter in the controller. The secondary counter will count from zero at the beginning of the slot at time $T_0$ and will reach a maximum at the midpoint $T_M$ of the slot, when it will discharge to zero and commence counting again during the second half of the same slot. At the end $T_S$ of the slot, the secondary counter will overflow and again commence counting on the new cycle. When the fine synchronization request signal is received by the controller at time $T_{RO}$ of the fine synchronization request signal does not occur at the beginning $T_0$ of the slot as would be expected with a situation involving a zero sync. error and a zero propagation time. The nominal receipt time $T_{RO}$ is offset a distance from the beginning of the slot to cover the situation wherein the user transmits prior to the beginning of the slot because its oscillator frequency exceeds the nominal value. Upon receipt of the fine synchronization request signal by the controller, the secondary divider count is stopped as illustrated at 61 and held until the midpoint $T_M$ of the slot is reached at which time the count resumes as shown by the curve 62. When the counter reaches its capacity, it will overflow at time $T_{XO}$ and the count will be returned zero. Since the secondary counter is arranged to cycle twice during each user slot, if its counting is stopped at the time $T_{RO}$ and is permitted to resume at the midpoint $T_M$ of the slot, the overflow time $T_{XO}$ will be spaced a distance from the end of the slot which is equal to the distance between $T_{RO}$ and the beginning of the slot. If the fine synchronization reply signal is transmitted by the controller at time $T_{XO}$, then it will be transmitted a distance from the end of the slot which is equal to the distance between the beginning of the slot and the receipt of the fine synchronization request signal.

FIG. 4B of the drawings shows the operation of the secondary counter of the controller for the situation where the synchronization error E is other than zero. In this figure, 61, 62 and 63 again show the counter output for a zero synchronization error, while curve 64 represents the counter output for the receipt of an early fine synchronization request signal at time $T_{RE}$ and curve 65 shows the counter output for the receipt of a late fine synchronization request signal at time $T_{RL}$. These curves illustrate that the elapsed time between the beginning of the slot $T_0$ and the early request signal $T_{RE}$ is equal to the elapsed time between the transmission time $T_{XE}$ for the fine sync. reply signal and the end $T_S$ of the slot and that the same situation obtains for the receipt of the late fine sync. request at time $T_{RL}$ and the transmission of the late fine sync. reply at time $T_{XL}$.

The secondary counter operation of the user member of the community is shown in FIG. 5A of the drawings for the situation where there is a zero synchronization error and the RF propagation time is neglected. The user secondary counter may be set to begin counting at the beginning of a typical user slot at time $T_0$ and to continue counting until the end $T_S$ of the slot, when the counter will overflow and commence counting again. When the fine synchronization reply signal is received by the user this counter would be stopped and the count would represent the time $T_{XO}$ at which this signal is received. Since the elapsed time between the receipt of the fine synchronization reply signal at time $T_{XO}$ and the end $T_S$ of the slot is equal to double the synchronization error E, if the user secondary counter was to be employed in this manner, the time $T_{XO}$ would occur at the end of the slot at time $T_S$, so that only negative synchronization errors could be measured in the user slot. Accordingly, in order to measure both positive and negative synchronization errors, the user secondary counter is preloaded as shown in FIG. 5A of the drawings so that the counter will have reached a predetermined count at the beginning $T_0$ of the user slot and will overflow at a time $T_{XO}$ which is a predetermined time from the end $T_S$ of the slot as shown by the sawtooth curves 70 and 71 in FIG. 5A. In FIG. 5A, the user transmits its fine synchronization request signal at time $T_{RO}$ and, for a zero synchronization error and neglecting RF propagation time, the fine synchronization reply signal transmitted by the controller will be received at time $T_{XO}$ when the secondary counter of the user would normally overflow, so that the count reached by the user secondary counter would be zero.

FIG. 5B of the drawings illustrates the receipt of fine syncronization reply signals at times before and after the nominal receipt time of $T_{XO}$ which respectively indicate negative and positive synchronization errors. It may be noted that the fine synchronization request signal will always be transmitted by the user at the time $T_{RO}$ in its own individually-assigned slot. As seen in FIG. 5B, when the fine synchronization reply signal is received by the user at a time $T_{XL}$ which is earlier than the nominal receive time $T_{X0}$, the user counter will be stopped at some point on the curve 70 as illustrated by the solid line 72 which will indicate that a negative synchronization error exists having a magnitude indicated by the stored count in the counter. If the fine synchronization reply signal is received by the user at a time $T_{XE}$ which is later than the nominal receive time $T_{X0}$, the counter will be stopped at some point on the curve 71 as shown by the solid line 73 which will indicate a positive synchronization error having a magnitude indicated by the stored count. Neglecting RF propagation time, a zero synchronization error will be indicated by a count of zero in the counter, since the counter will normally overflow at time $T_{X0}$. If the count is in the range between zero and a count of PC which represents the preload count, a positive synchronization error will be indicated. A negative synchronization error will be indicated by a count lying in the range between the preload count PC and the maximum count MC at which the counter overflows. By virtue of this arrangement, both the magnitude and sign of the synchronization error may be determined by the secondary counter of the user. Positive errors may be represented in binary notation and negative errors may be represented in 2's complement notation. The resulting synchronization error E may then be processed by the digital filter.

During initial synchronization adjustments when the synchronization error E may be large, the unity gain time adjustments may be handled directly by the main counter 30 of the user members of the community. As seen in FIG. 6A of the drawings, the slot timer section of the main counter 30 of the user commences counting at the beginning $T_0$ of the user slot and reaches a predetermined end count at the end $T_S$ of the slot as shown by the sawtooth curve 75 if a zero synchronization error is assumed and RF propagation time is neglected. The user slot timer section is arranged to count by 2's to a higher end count upon the receipt of a fine synchronization reply signal at time $T_{X0}$. The counting by 2's of the slot timer is shown by the dashed curve 76 in FIG. 6A. If the slope of curve 75 is M, then the slope of the curve 76 will be 2M because of the counting by 2's. Since a zero synchronization error has been assumed in FIG. 6A, no adjustment will be made in the end time $T_S$ of the slot and the counter will overflow at this time. FIG. 6B of the drawings illustrates the slot timer operation of the user main counter when negative and positive synchronization errors exist. When a fine synchronization reply signal is received by the user at time $T_{XL}$ for a negative synchronization error, the elapsed time between $T_{XL}$ and $T_{X0}$ is equal to twice the synchronization error E as explained previously. Upon receipt of this signal, the slot timer section of the user main counter commences counting by 2's as shown by the dashed line 77 until it reaches the higher end count for the slope 2M when the counter will overflow at the time $T_{SL}$. Because the slope of the line 77 is twice the slope of line 75, it may be demonstrated mathematically that the elapsed time between $T_{SL}$ and $T_S$ is exactly equal to the synchronization error E. In a similar fashion, when a fine synchronization reply signal is received by the user at a time $T_{XE}$ indicating a positive synchronization error, the elapsed time between $T_{X0}$ and $T_{XE}$ is equal to twice the synchronization error E. Upon receipt of this signal, the slot timer section of the user main counter commences counting by 2's as shown by the dot-dash curve 78 unitl the higher end count is reached and the counter overflows at time $T_{SE}$ which is separated from the nominal end $T_S$ of the user slot by an elapsed time equal to the synchronization error E. By virtue of this arrangement, the sensed synchronization error 2E may be employed directly to provide a slot correction exactly equal to the error E when the end count is reached, which greatly simplifies the basic digital filter implementation.

Figure 7:
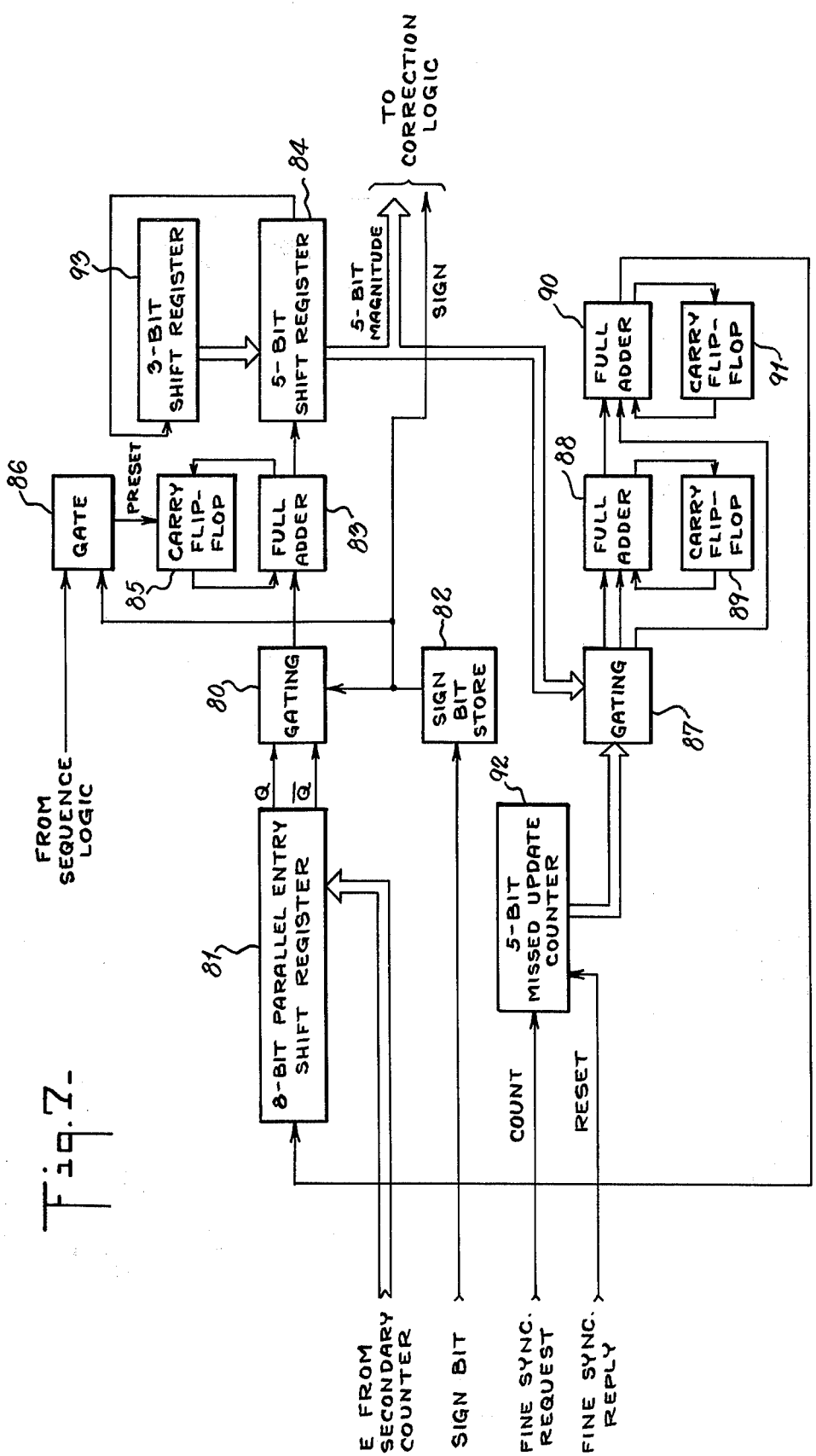
FIG. 7 is a functional block diagram showing the arithmetic section processor which generates the oscillator frequency and phase corrections and the clock corrections.

A functional block diagram for the arithmetic section processor of the digital filter which generates the frequency, phase and clock corrections for the user member of the community is shown in FIG. 7 of the drawings. The processor provides the filter algorithms described previously and functions essentially as a serial processor which generates the frequency, clock and phase corrections in a single pass. As seen in FIG. 7, the magnitude and sign of the synchronization error E are applied to the processor and the error shifts through gating 80 which receives the output of an 8-bit parallel entry shift register 81 and a sign bit store 82. The shifting continues through a full adder 83 which supplies its output to a 5-bit shift register 84. Gating 80, full adder 83 and an associated carry flip-flop 85 which is responsive to a sign bit controlled gate 86 enable the magnitude of the synchronization error to be obtained when the error is negative. After the first five shifts, the magnitude of the error is stored in the shift register 81 and is employed for making the frequency adjustment to the oscillator 31 of FIG. 2 of the drawings. The magnitude and sign of the error are applied to increment control 56 which provides the frequency corrections for the oscillator through the up-down counter 33 and the digital-to-analog converter 32. For a given synchronization error, magnitude and sign, the increment control and correction logic adjusts the up-down counter 33 by one pulse for each count in the error. The gain of the frequency correction may be determined by selecting the bit in the up-down counter where the correction pulses are inserted. With the oscillator gain values set forth in Table II, the two insertion points utilized in the up-down counter would correspond to oscillator gains of one-fourth and 1/256.

After the oscillator frequency has been corrected, the shifting of the error continues through a multiplier comprising gating 87, full adder 88 with associated carry flip-flop 89, and full adder 90 with associated carry flip-flop 91. The inputs to the multiplier are controlled by a 5-bit missed update counter 92 which is coupled to the gating 87 and which receives its input from the fine synchronization request and fine synchronization reply pulse signals. This arrangement provides an effective approximation of a gain which varies as a function of time between fine synchronization updates. The output of the foregoing multiplier is applied to the shift register 81 where the least significant bits represent fractional control of the least significant bit of the main counter in the user synchronization system. The least significant bits which are shifted into the shift register 81 are also shifted into shift register 84 and associated 3-bit shift register 93 where they are stored for subsequent use for controlling the phase of the oscillator. The aforementioned shifting continues unitl the integer value of the filter output is aligned in shift register 84 where it is supplied to the correction logic and increment control 56 to adjust the count in the main counter 30 to provide the clock or time correction.

The phase corrections to the oscillator 31 are made by integrating oscillator frequency over a known time interval and may be accomplished by introducing a frequency change of $\Delta f$ for a known period of time T and then removing the frequency increment. The effect of this adjustment is to shift the phase $\phi$ by an amount $\Delta\phi$ which is equal to the product of the frequency increment $\Delta f$ in Hertz and the integration time T in seconds. The $\Delta f$ frequency insertions are made at the appropriate gain taps on the up-down counter 33 and the timing of the insertion-removal of the frequency increments in controlled by the sequencing logic 53.

From the foregoing description of the preferred embodiment of the invention, it is believed apparent that the synchronization system of the invention provides a simple and effective arrangement for synchronizing one or more local clock systems or time bases with a master clock system or time base. The corrections which are made not only include correction of the local clock, but also frequency and phase corrections of the local oscillator which is used to drive the local clock. This permits the local clock systems to utilize local oscillators of a relatively inexpensive, commercial grade which have only nominal frequency stability characteristics. The synchronization technique utilized by the present invention provides for a number of control states having variable clock and oscillator correction gains. The gains which are employed in making the corrections depend upon the missed updates or the number of epochs between updates, so that the past history of error corrections is utilized in making the corrections at each update and the corrections are not based solely on the instantaneous synchronization error present at a given sampling time. The corrections are, in effect, based on a mean or average value of time base error rather than the instantaneous synchronization error. Although the time base synchronization technique of the invention has been described with reference to a community navigation system wherein a plurality of user or local clock systems are slaved to a controller or master clock system, it will be understood that the invention may be utilized in other and different systems. For example, a plurality of widely separated local computer clock systems could be slaved to the clock system of a master computer to provide for joint computational applications. In this situation, the digitally encoded, radio-transmitted coarse, fine request and fine reply synchronization signals could be replaced by simple pulses transmitted by telephone lines linking the master and local computer clock systems. In horological applications, remotely located time display clocks could be linked to a master clock by wire or radio signals and kept in synchronization by the aforementioned techniques.

Figure 8:
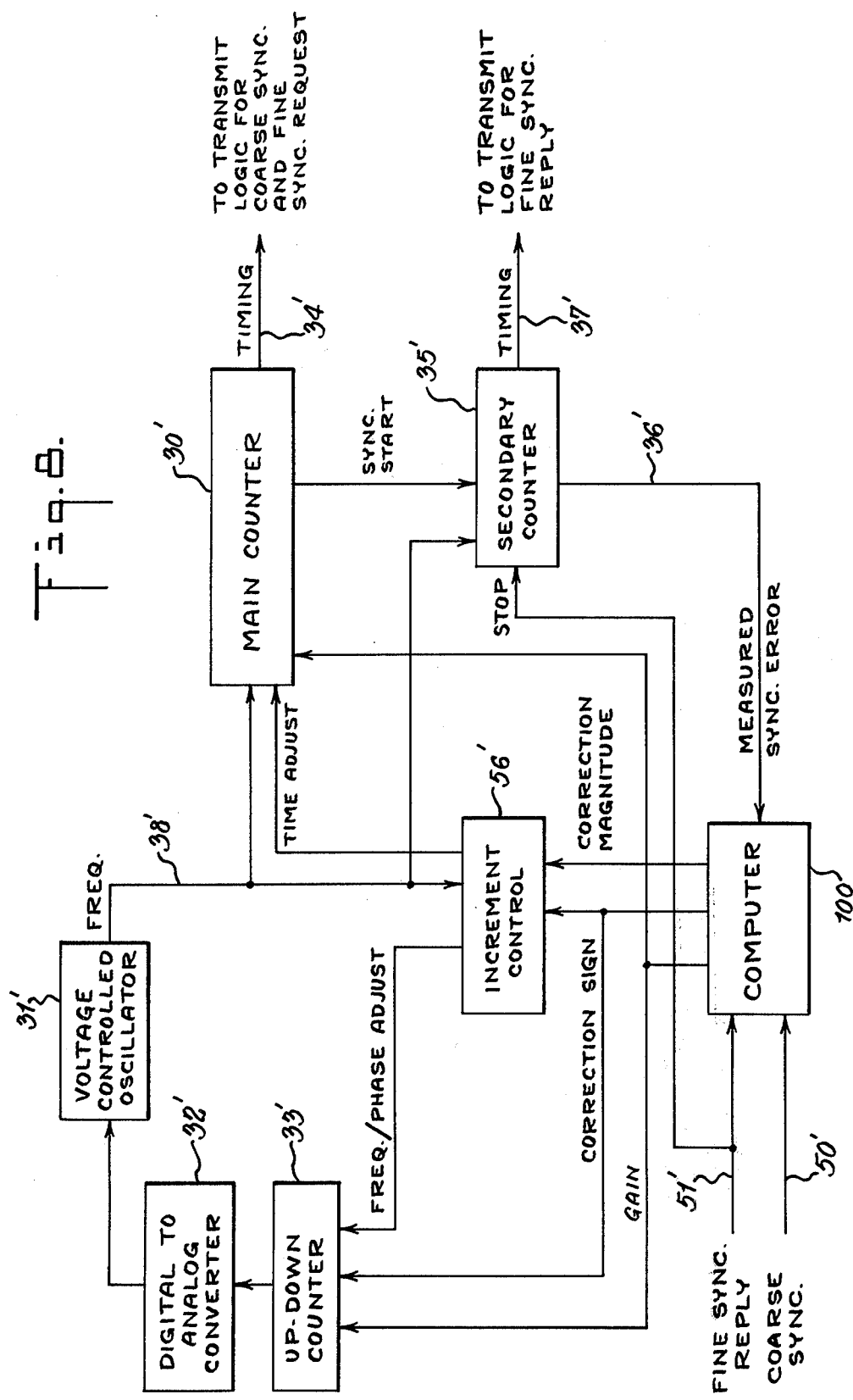
FIG. 8 is a functional block diagram of a time base synchronization system constituting an alternative embodiment of the invention.

FIG. 8 of the drawings illustrates an alternative embodiment of the invention wherein a suitable, commercially-available computer may be utilized to provide the error processing and control sequence functions. In this embodiment of the invention, the main counter 30', the voltage controlled oscillator 31', the digital-to-analog converter 32', the up-down counter 33', the secondary counter 35' and the increment control 56' are the same as the correspondingly numbered components in the embodiment of FIG. 2 of the drawings. In this arrangement, a computer 100 performs the functions of the sync. state control logic 52, the sequencing logic 53, the error limit logic 54 and the arithmetic section logic 55 which are utilized in the embodiment of FIG. 2. The software for the computer 100 would utilize the Kalman filter techniques previously described and would provide the control state sequencing logic for the system in accordance with known programming techniques.

It is believed apparent that many changes could be made in the construction and described uses of the foregoing time base synchronization system and many seemingly different embodiments of the invention could be constructed without departing from the scope thereof. For example, it is believed obvious that the previously described gain settings and control states could be varied to suit a particular application and the characteristics of other and different clock systems utilized. Accordingly, it is intended that all matter contained in the above description or shown in the accompanying drawings shall be interpreted as illustrative and not in a limiting sense.

What is claimed is:

1. A time base synchronization system for synchronizing a local time base consisting of a cyclically recurring series of sequential time slots generated by a voltage controlled local oscillator and local digital main counter with a master time base consisting of a cyclically recurring series of sequential time slots generated by a master oscillator and master main digital counter comprising coarse sycnhronizing means for bringing said time bases into coarse synchronization, said coarse synchronizing means comprising means coupled to the master main counter for generating a coarse synchronization signal at the beginning of the first time slot in said series of time slots in the master time base, and means coupled to the local main counter and responsive to said coarse synchronization signal for adjusting the local main counter to begin generating the said first time slot in the series of slots in the local time base upon receipt of said coarse signal; and fine synchronizing means for bringing said time bases into fine synchronization, said fine synchronizing means comprising means coupled to the local main counter for generating a fine synchronization request signal at the start of a predetermined one of the remaining time slots in the local time base, means including a master secondary counter coupled to the master main counter for measuring the elapsed time between the receipt of said fine synchronization request signal by the master main counter and the beginning of said predetermined one time slot in the master time base and for generating a fine synchronization reply signal at the beginning of a time period before the end of said predetermined one slot in the master time base which is equal to said elaspsed time, means including a local secondary counter coupled to the local main counter for measuring the elapsed time between the receipt of said fine synchronization reply signal by the local and the end of said predetermined one time slot in the local time base to produce a digital synchronization error signal, means for computing from said digital synchronization error signal a frequency error, time error and phase error, means for coupling said frequency and phase errors as corrections to said local oscillator and said time error as a correction to said local main counter, synchronization state logic means obtaining as inputs said coarse synchronization signal and fine synchronization reply signal for generating a time varying gain output in dependence on the number of cycles of said time slots between error corrections, said gain outputs coupled respectively to said local oscillator and said local main counter to control the gain at which said correction signals are entered thereto, error limit logic means coupled to said synchronization error measuring means for producing error limit signals when said error exceeds a predetermined range of values, and sequencing logic means having as inputs said fine synchronization reply signal and the error limit signal output of said error limit logic means and having outputs coupled to to said synchronization state logic means and said means for computing and responsive to said fine synchronization and error limit signals for producing said sequencing signals to cause said synchronization system to follow a programmed control state sequence in which transfer between control states for large initial errors is made automatically for a predetermined number of sequentially occurring corrections and is dependent upon the magnitude of the synchronization error for subsequent corrections.

2. A time base synchronization system as claimed in claim 1 wherein
the local time base system is remotely located from the master time base system, and
said coarse and fine synchronization signals are transmitted between said local and master systems by means of wire.

3. A time base synchronization system as claimed in claim 1 wherein
the local time base system is remotely located from the master time base system, and
said coarse and fine synchronization signals are transmitted between said local and master systems by means of radio transmissions.

4. A time base synchronization system as claimed in claim 3 wherein said coarse synchronization, fine synchronization request and fine synchronization reply signals are digitally encoded radio signals.

5. A time base synchronization system as claimed in claim 1 wherein
said local oscillator adjusting means comprises an up-down digital counter having the output thereof coupled to the control voltage input of said local oscillator through a digital-to-analog converter,
said local oscillator correction signals comprise digital input signals to said up-down counter representing the magnitude and sign of the frequency correction, and
the local oscillator frequency correction gain is controlled by controlling the bit in said up-down counter where the digital input signals representing the magnitude of the frequency change are applied.

6. A time base synchronization system as claimed in claim 5 wherein phase adjustment of the local oscillator output is obtained by introducing a predetermined increment of frequency into the oscillator output for a predetermined time period and then removing the frequency increment at the end of said time period, to thereby adjust the phase of the oscillator output by an amount equal to the product of the frequency increment and said period of time.

7. A time base synchronization system as claimed in claim 1 wherein
the control state for the first cyclic correction has a unity main counter correction gain and a zero oscillator correction gain to allow for the correction of large initial phase errors,
the control states for the second through the fifth cyclic corrections have a unity main counter correction gain and a high oscillator correction gain to allow for the correction of large initial frequency errors, and
the steady state control states for the sixth and subsequent cyclic corrections have a low oscillator correction gain and a main counter correction gain which is equal to a low gain plus a variable gain which is a function of the number of time base cycles between corrections.

8. A time base synchronization system as claimed in claim 7 wherein the synchronization system remains in the control state for the sixth cyclic correction for so long as the measured synchronization error does not exceed a predetermined amount for a predetermined number of subsequent successive cyclic corrections and is returned to a control state having higher oscillator and counter correction gains if the error exceeds said predetermined amount for said predetermined number of subsequent cyclic corrections.

9. A time base synchronization system as claimed in claim 1 wherein the local main counter is corrected in time by causing it to count at double its normal rate upon receipt of said fine synchronization reply signal for control states having large main counter correction gains.

10. A time base synchronization system for synchronizing a local time base system with a master time base system, the master time base system adapted to transmit a coarse synchronization signal and a fine synchronization reply signal, in response to a request from the local time base system, said local time base system including means for receiving said coarse synchronization signal and fine synchronization signal, said synchronization system comprising:
  a. a controllable oscillator;
  b. means obtaining an input from said oscillator for counting the pulses therefrom, said means being reset to zero in response to receipt of said coarse synchronization signal and providing a fine synchronization request output signal at a preset count;
  c. error measuring means for measuring the synchronization between the local and master time base systems having as inputs an output from said means for counting having a predetermined time relationship with said fine synchronization request output signal and said fine synchronization reply signal;
  d. means having as an input the synchronization error output of said error measuring means for generating a frequency error signal, a phase error signal and a time error signal;
  e. means for providing a control input to said oscillator; and
  f. means for respectively coupling said frequency and phase error to said means providing control input and said time error to said means for counting.

11. Apparatus according to claim 10 wherein said oscillator is a voltage controlled oscillator and said means providing a control input to said oscillator comprise a digital to analog converter having its analog output coupled as an input to said oscillator and an up/down counter having its outputs coupled to the digital inputs of said digital to analog converter and wherein said means for coupling said frequency error signal comprise means for incrementing said counter up and down in dependence on the magnitude and sign of said frequency error.

12. Apparatus according to claim 11 and further including synchronization state control logic means having as inputs said coarse synchronization signal said fine synchronization reply signal said synchronization control logic means arranged to provide a frequency gain output and a time correction gain output said gain output being respectively coupled to said up/down counter and said means for counting to control the stage of each of said means at which said frequency error and time error are entered.

13. Apparatus according to claim 12 wherein said means for determining said frequency, phase and time errors comprise serial arithmetic computation means and further including sequencing logic means having as an input said fine synchronization reply signal and responsive to the receipt of each of said reply signals to carry out a sequence in which said frequency error, time error and phase error are sequentially determined in said arithmetic unit, said sequencing logic means further providing sequencing output signals to said means for selectively coupling said error signals.

14. Apparatus according to claim 13 wherein said synchronization state control logic is arranged to reduce said gain output as the number of fine synchronization replys increases.

15. A time base synchronization system as claimed in claim 14 wherein phase adjustment of the local oscillator output is made by changing the local oscillator output frequency by a predetermined increment of frequency for a predetermined period of time and then eliminating the incremental frequency change, to thereby adjust the phase of the oscillator output by an amount which is equal to the product of the incremental frequency change and the said time period.

* * * * *